United States Patent
Honda et al.

(10) Patent No.: US 7,623,324 B2
(45) Date of Patent: Nov. 24, 2009

(54) MAGNETIC SENSING ELEMENT HAVING REACTIVE-ION-ETCHING STOP LAYER AND PROCESS FOR PRODUCING SAME

(75) Inventors: Kenji Honda, Niigata-ken (JP); Naohiro Ishibashi, Niigata-ken (JP); Daigo Aoki, Niigata-ken (JP); Yasuo Hayakawa, Niigata-ken (JP); Yoshihiro Nishiyama, Niigata-ken (JP); Toshihiro Kobayashi, Niigata-ken (JP)

(73) Assignee: TDK Corporation, Tokyo (JP)

( * ) Notice: Subject to any disclaimer, the term of this patent is extended or adjusted under 35 U.S.C. 154(b) by 287 days.

(21) Appl. No.: 11/424,495

(22) Filed: Jun. 15, 2006

(65) Prior Publication Data

US 2006/0291097 A1    Dec. 28, 2006

(30) Foreign Application Priority Data

Jun. 22, 2005    (JP)    ............... 2005-181376

(51) Int. Cl.
*G11B 5/33*    (2006.01)
*G11B 5/127*    (2006.01)
(52) U.S. Cl. ............... 360/324.12; 360/324.2
(58) Field of Classification Search ............ 360/324.12, 360/324.2, 324, 125.02, 99.09; 428/156, 428/811.2
See application file for complete search history.

(56) References Cited

U.S. PATENT DOCUMENTS

| | | | |
|---|---|---|---|
| 6,967,825 B2 * | 11/2005 | Gill | 360/324.12 |
| 7,271,982 B2 * | 9/2007 | MacDonald et al. | 360/125.02 |
| 7,390,584 B2 * | 6/2008 | Daughton et al. | 428/811.2 |
| 2003/0179496 A1 * | 9/2003 | Jayasekara | 360/99.09 |
| 2003/0190460 A1 * | 10/2003 | Hasegawa et al. | 428/156 |
| 2004/0207959 A1 | 10/2004 | Saito | |
| 2004/0207960 A1 | 10/2004 | Saito et al. | |
| 2004/0207962 A1 | 10/2004 | Saito et al. | |
| 2006/0158790 A1 * | 7/2006 | Freitag et al. | 360/324 |

FOREIGN PATENT DOCUMENTS

| | | |
|---|---|---|
| JP | 2004-335071 | 11/2004 |
| JP | 2005-44489 | 2/2005 |

* cited by examiner

*Primary Examiner*—Andrea L Wellington
*Assistant Examiner*—Adam B Dravininkas
(74) *Attorney, Agent, or Firm*—Brinks Hofer Gilson & Lione

(57) ABSTRACT

A magnetic sensing element including a laminate and a bias layer is provided. A first reactive-ion-etching (RIE) stop layer is disposed on a free magnetic layer. Second RIE stop layers are disposed on bias layers. The first and second RIE stop layers function as stop layers when layers on the first and second RIE stop layers are removed by reactive ion etching in a production process. Reactive ion etching is completed when the first RIE stop layer and the second RIE stop layers are exposed, the first and second RIE stop layers being disposed at almost the same height. Also provided is a process for producing the magnetic sensing element.

13 Claims, 10 Drawing Sheets

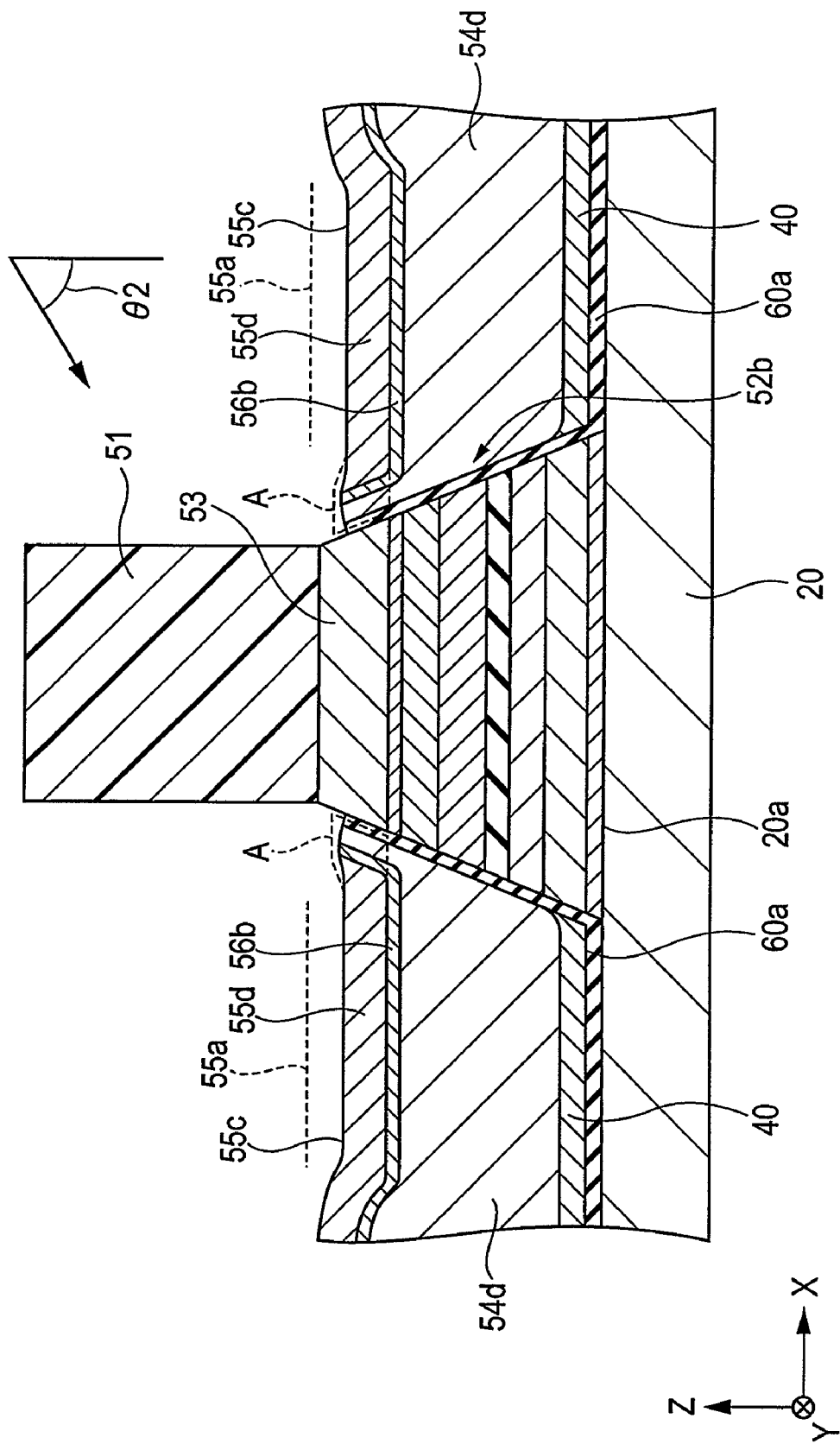

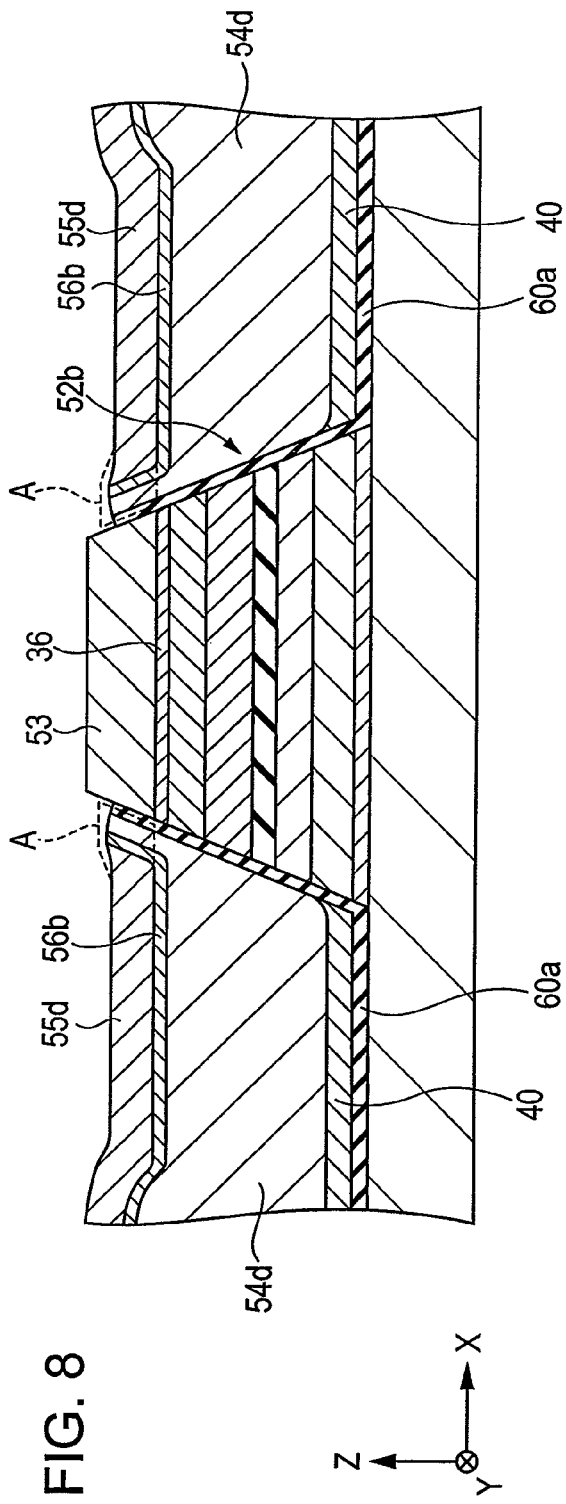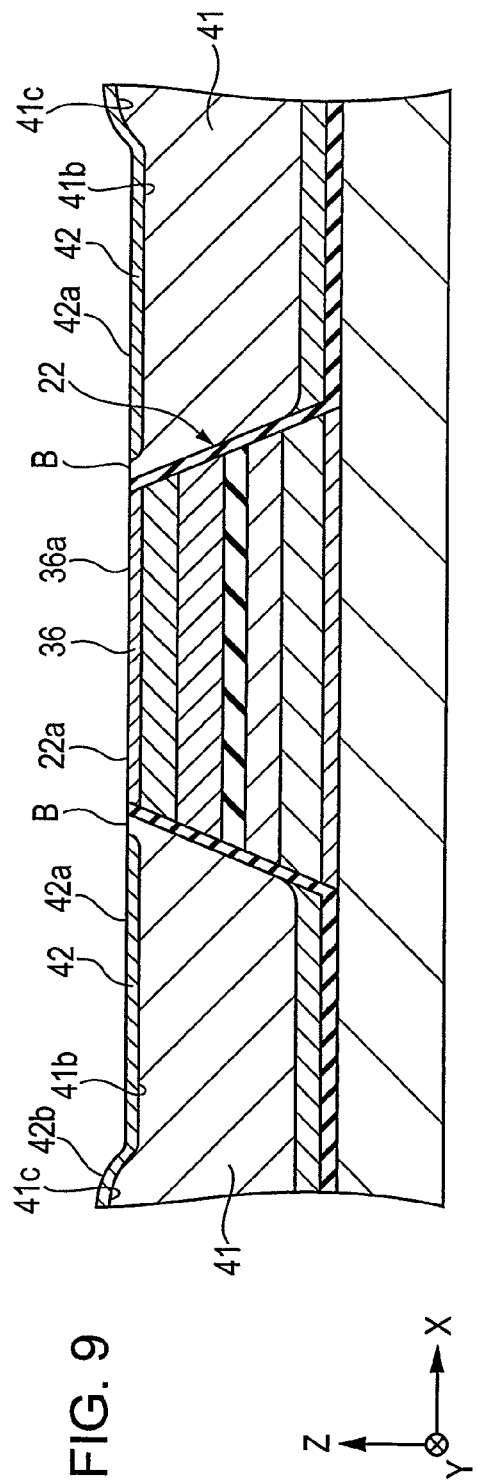

MAGNETIC SENSING ELEMENT HAVING REACTIVE-ION-ETCHING STOP LAYER AND PROCESS FOR PRODUCING SAME

BACKGROUND

1. Field

A magnetic sensing element including a laminate and a bias layer is provided. The magnetic sensing element having a smaller variation in height between the top face of the laminate and top faces of regions where bias layers are disposed. The bias layers are disposed at both sides of the laminate in the track width direction, and the magnetic sensing element has a smaller variation in the distance between shield layers. Also provided is a process for producing the magnetic sensing element.

2. Description of the Related Art

FIGS. 10 to 15 show a process for producing a known tunneling magnetic sensing element. Each of Figures is a cross-sectional view in the production process of the tunneling magnetic sensing element taken along a plane parallel to a face facing a recording medium (the plane parallel to the X-Z plane).

As shown in FIG. 10, a laminate 7 is formed on a bottom shield layer 1, the laminate 7 including, an antiferromagnetic layer 2, a pinned magnetic layer 3, a nonmagnetic material layer 4, a free magnetic layer 5, and protective layer 6, formed in that order. The layers constituting the laminate 7 are formed on the entire surface of the bottom shield layer 1 by sputtering or the like. The protective layer 6 is composed of, for example, tantalum (Ta).

FIG. 11 shows a step of forming a resist layer 8 on the laminate 7. A resist is applied on the entire top face of the laminate 7 and is then subjected to exposure and development to form the resist layer 8 shown in FIG. 11. Portions of the laminate 7 not covered with the resist layer 8 are etched by ion milling to form the laminate 7 having a shape shown in FIG. 12 on the bottom shield layer 1.

As shown in FIG. 13, an underlying insulating layer 9 is formed over the top faces 1a of the bottom shield layer 1 at the both sides of the laminate 7 in the track width direction (X direction shown in the figure), both side end faces 7a and 7a of the laminate 7 in the track width direction (X direction), both side end faces 8a and 8a of the resist layer 8 in the track width direction (X direction), and the top face 8b of the resist layer 8. A hard bias layer 10 is formed on the underlying insulating layer 9. A milling stop layer 11 resistant to ion milling is formed on the hard bias layer 10. Here, the underlying insulating layer 9, the hard bias layer 10, and the milling stop layer 11 are also formed on the front end face (face facing toward the direction opposite to the Y direction) and rear end face (face facing toward the Y direction) of the resist layer 8. That is, the underlying insulating layer 9, the hard bias layer 10, and the milling stop layer 11 that each have a small thickness are disposed on the entire surface of the resist layer 8, except for the bottom face of the resist layer 8.

FIG. 14 shows a step of removing the underlying insulating layer 9, the hard bias layer 10, and the milling stop layer 11 disposed on the surface (the side end faces 8a and 8a, the top face 8b, the front end face, and the rear end face) of the resist layer 8 by ion milling.

The milling stop layer 11 is composed of a material having a milling rate lower than those of materials constituting the hard bias layer 10 and the underlying insulating layer 9 in ion milling. For example, the milling stop layer 11 is composed of tantalum (Ta). Hereinafter, the milling stop layer 11 on the surface of the resist layer 8 is referred to as an "over-resist milling stop layer 11a". The milling stop layer 11 on the hard bias layer 10 disposed at each side of the laminate 7 in the track width direction (X direction) is referred to as an "on-bias milling stop layer 11b".

As shown in FIG. 14, the thickness H1 of the over-resist milling stop layer 11a disposed on the side end face 8a of the resist layer 8 is defined as a thickness in the direction parallel to the track width direction (X direction). The thickness H1 of the over-resist milling stop layer 11a is smaller than that of the on-bias milling stop layer 11b. The over-resist milling stop layer 11a can be successfully removed by adjusting a milling angle in ion milling. After the removal of the over-resist milling stop layer 11a by ion milling, the hard bias layer 10 and the underlying insulating layer 9 disposed on the side end face 8a and the like of the resist layer 8 are removed by ion milling. The underlying insulating layer 9, the hard bias layer 10, the over-resist milling stop layer 11a, and the on-bias milling stop layer 11b that have removed by ion milling are indicated by dotted lines.

As shown in FIG. 14, the on-bias milling stop layer 11b has been partially removed by ion milling. The on-bias milling stop layer 11b has a sufficient thickness so as not to be entirely removed in the ion-milling step. Thus, part of the on-bias milling stop layer 11b appropriately remains on the hard bias layer 10. Therefore, the remaining on-bias milling stop layer 11b can prevent the hard bias layer 10 under the on-bias milling stop layer 11b from being etched by ion milling.

The resist layer 8 that has been exposed by removing the hard bias layer 10 and the over-resist milling stop layer 11a is removed by dissolution with a dissolving solution, thereby resulting in the appearance of the top face 7b of the laminate 7, the top face 7b being identical to the top face of the protective layer 6. By performing the above-described steps, a tunneling magnetic sensing element is completed, the tunneling magnetic sensing element including the laminate 7 on the bottom shield layer 1, the hard bias layer 10 at each side of the laminate 7 in the track width direction (X direction), and the on-bias milling stop layer 11b on part of each hard bias layer 10.

FIG. 15 shows a step of forming a top shield layer 15 on the tunneling magnetic sensing element.

Japanese Unexamined Patent Application Publication Nos. 2004-335071 and 2005-44489 each disclose a current-per-pendicular-to-plane-mode (CPP-mode) magnetic sensing element.

The tunneling magnetic sensing element produced by the above-described steps disadvantageously includes a large step height between the top face 7b of the laminate 7 and the top face 11b1 of the on-bias milling stop layer 11b disposed (remaining) at each side of the laminate 7 in the track width direction (X direction). As shown in FIG. 15, the top faces 11b1 of the on-bias milling stop layers 11b are disposed at positions lower than that of the top face 7b of the laminate 7. This is because the on-bias milling stop layers 11b are partially etched by ion milling in the ion milling step shown in FIG. 14.

Each underlying insulating layer 9 and each hard bias layer 10 have milling rates significantly higher than those of the on-bias milling stop layers 11b in ion milling and are disposed between the laminate 7 and the corresponding on-bias milling stop layer 11b. The underlying insulating layers 9 and the hard bias layers 10 disposed here are not covered with the on-bias milling stop layers 11b. The top face A of each uncovered underlying insulating layer 9 and each uncovered hard bias layer 10 between the laminate 7 and the corresponding on-bias milling stop layer 11b is etched by ion milling at a high etch rate. Consequently, the position of each top face A is lower than that of the top face 11*b*1 of each on-bias milling stop layer 11*b*, thus resulting in a very high step height between the corresponding top face A and the top face 7*b* of the laminate 7. Furthermore, an area ranging from each top face A to the top face 11*b*1 of the corresponding on-bias milling stop layer 11*b* has a curved surface.

In the tunneling magnetic sensing element produced by such a known production process, for example, a distance H2 is defined as a distance between the bottom shield layer 1 and the top shield layer 15 at a region where the laminate 7 is disposed, and a distance H3 is defined as a distance between the bottom shield layer 1 and the top shield layer 15 at each side of the laminate 7 in the track width direction (X direction). Comparison of the distance H2 with the distance H3 shows a large difference. Furthermore, there is a large variation in the distance between the bottom shield layer 1 and the top shield layer 15 at each side of the laminate 7 in the track width direction (X direction) because the position of the top face in the vicinity of the laminate 7 is significantly lower than that of the top face 7*b* of the laminate 7.

If the film-forming angle and the like are adjusted in such a way that the underlying insulating layer 9, the hard bias layer 10, and the milling stop layer 11 are not formed on the surface of the resist layer 8 unlike FIG. 13 when the underlying insulating layer 9, the hard bias layer 10, and the milling stop layer 11 are formed, the ion milling step shown in FIG. 14 is not required, thus not leading to the above-described problems. However, if the above-described adjustment is performed, the thick hard bias layer 10 and the like cannot be formed at each side of the laminate 7 in the track width direction (X direction) because of a shadow effect of the very thick resist layer 8. Furthermore, when the unnecessary laminate 7 shown in FIG. 12 is removed by ion milling, part of a material constituting the laminate 7 is deposited on the surface of the resist layer 8 (redeposition problem). After all, it was found that an ion milling step of removing the redeposit is required. Thus, the known process for producing the tunneling magnetic sensing element was not able to reduce the variation in the distance between the shield layers.

SUMMARY

To overcome the above-described problems, a magnetic sensing element having a low distance between shield layers and a process for producing the magnetic sensing element is provided.

A magnetic sensing element of the present invention includes a bottom shield layer, a top shield layer, a laminate having at least a pinned magnetic layer, a nonmagnetic material layer, a free magnetic layer, and a first reactive-ion-etching (RIE) stop layer, provided in that order from the bottom. The first RIE stop layer is the uppermost layer of the laminate and functions as a stop layer for reactive ion etching. Bias layers are disposed at both sides of the laminate in the track width direction. Second reactive-ion-etching (RIE) stop layers are each disposed on at least part of the corresponding bias layer. The second RIE stop layers function as stop layers for reactive ion etching. The laminate, the bias layers first RIE stop layer, and the second RIE stop layers are disposed between the bottom shield layer and the top shield layer.

The magnetic sensing element has a small variation in height between the top face of the laminate and the top face of a region including the bias layer disposed at each side of the laminate. Furthermore, the magnetic sensing element has a smaller variation in the distance between the shield layers. Therefore, the magnetic sensing element has appropriately improved read characteristics.

The first RIE stop layer and the second RIE stop layers are preferably composed of the same material. This effectively reduces the variation in the distance between the shield layers. Preferably, the first RIE stop layer and the second RIE stop layers are each composed of at least one element selected from the group consisting of Cr, Pt, Ir, Ru, Rh, Pd, and Ag. This achieves appropriately reduced etch rates of the first and second RIE stop layers in reactive ion etching, thereby more effectively reducing the variation in the distance between the shield layers.

More preferably, the top face of the first RIE stop layer and at least part of the top face of each second RIE stop layer are disposed at the same height and are each a planarized surface. This more effectively reduces the variation in the distance between the shield layers.

Furthermore, the magnetic sensing element is a tunneling magnetic sensing element including, for example, an insulating barrier layer disposed as the nonmagnetic material layer. This achieves appropriately improved read output even when the first RIE stop layer is disposed in the laminate.

A process for producing a magnetic sensing element includes the steps of:

(a) forming a laminate having at least a pinned magnetic layer, a nonmagnetic material layer, and a free magnetic layer, provided in that order on a bottom shield layer, forming a first reactive-ion-etching (RIE) stop layer on the free magnetic layer, the first RIE stop layer functioning as a stop layer for reactive ion etching, and forming a reactive-ion-etching-controlling (RIE-controlling) layer on the first RIE stop layer, the etch rate of the RIE-controlling layer in reactive ion etching being higher than that of the first RIE stop layer;

(b) forming a resist layer having a predetermined shape on the laminate and removing the portion of the laminate not covered with the resist layer;

(c) forming bias layers at both sides of the laminate in the track width direction after the step (b) and forming a second reactive-ion-etching (RIE) stop layer on each bias layer, the second RIE stop layers functioning as stop layers for reactive ion etching;

(d) forming a milling stop layer on each second RIE stop layer, the milling stop layers functioning as stop layers for ion milling, and the milling stop layers each being composed of a material such that the etch rate of the material in reactive ion etching is higher than that of each second RIE stop layer;

(e) removing an unnecessary layer adhering to the periphery of the resist layer by ion milling;

(f) removing the resist layer;

(g) removing the RIE-controlling layer and the milling stop layers by reactive ion etching; and (h) forming a top shield layer over the first RIE stop layer and the second RIE stop layer.

The milling stop layer functions as a protective layer for protecting the second RIE stop layer from ion milling. Ultimately, the milling stop layer is removed. The top face of the milling stop layer is etched by ion milling in the step (e). At the end of the step (e), a large step height is present between the top face of the milling stop layer and the top face of the laminate. In known techniques, the top shield layer is formed on the surface having the step height without any processing. In the present embodiment, the milling stop layer is removed by reactive ion etching. At this time, the RIE-controlling layer is disposed on the first RIE stop layer. In the step (g), the RIE-controlling layer is removed together with the milling stop layer. If the RIE-controlling layer is not disposed, the first RIE stop layer is etched by reactive ion etching for a long time in the step (g). At worst, the first RIE stop layer is completely removed. As a result, the laminate below the first RIE stop layer is etched by reactive ion etching. Alternatively, even if the first RIE stop layer is not entirely removed, in other words, even if part of the first RIE stop layer is left, there is a large step height between the top face of the first RIE stop layer and the top face of the second RIE stop layer at the end of the step (g); hence, the variation in the distance between the shield layers cannot be effectively reduced. Therefore, the RIE-controlling layer is required to be disposed on the first RIE stop layer.

In the step (g), reactive ion etching is stopped when the RIE-controlling layer and the milling stop layer are removed by reactive ion etching to expose the first and second RIE stop layers. The first and second RIE stop layers are etched to the same degree by reactive ion etching, thus not resulting in a step height. Alternatively, even when a step height exists, the step height is lower than that in the known art. Therefore, it is possible to easily and appropriately produce a magnetic sensing element having a smaller variation in the distance between the shield layers compared with that in the known art.

The RIE-controlling layer and the milling stop layers are preferably composed of the same material. This achieves a more effectively reduced variation in the distance between the shield layers compared with that in the known art.

Preferably, the RIE-controlling layer and the milling stop layer are each composed of at least one element selected from the group consisting of Ta, Mo, W, and Ti. This easily and appropriately achieves a higher etching rate of the milling stop layer in reactive ion etching compared with those of the first RIE stop layer and the second RIE stop layers.

The first RIE stop layer and the second RIE stop layer are preferably composed of the same material. This more effectively achieves a lower step height between the top face of the first RIE stop layer and the top face of each second RIE stop layer and achieves a smaller variation in the distance between the shield layers, as compared with those in the known art.

Preferably, the first RIE stop layer and the second RIE stop layer are each composed of at least one element selected from the group consisting of Cr, Pt, Ir, Ru, Rh, Pd, and Ag. This easily and appropriately achieves lower etch rates of the first and second RIE stop layers in reactive ion etching compared with those of the RIE-controlling layer and the milling stop layer, which is preferable.

BRIEF DESCRIPTION OF THE DRAWINGS

FIG. 7 is a process drawing (cross-sectional view) showing a step subsequent to the step in FIG. 6;

FIG. 8 is a process drawing (cross-sectional view) showing a step subsequent to the step in FIG. 7;

FIG. 9 is a process drawing (cross-sectional view) showing a step subsequent to the step in FIG. 8;

DESCRIPTION OF THE PREFERRED EMBODIMENTS

Figure 1:
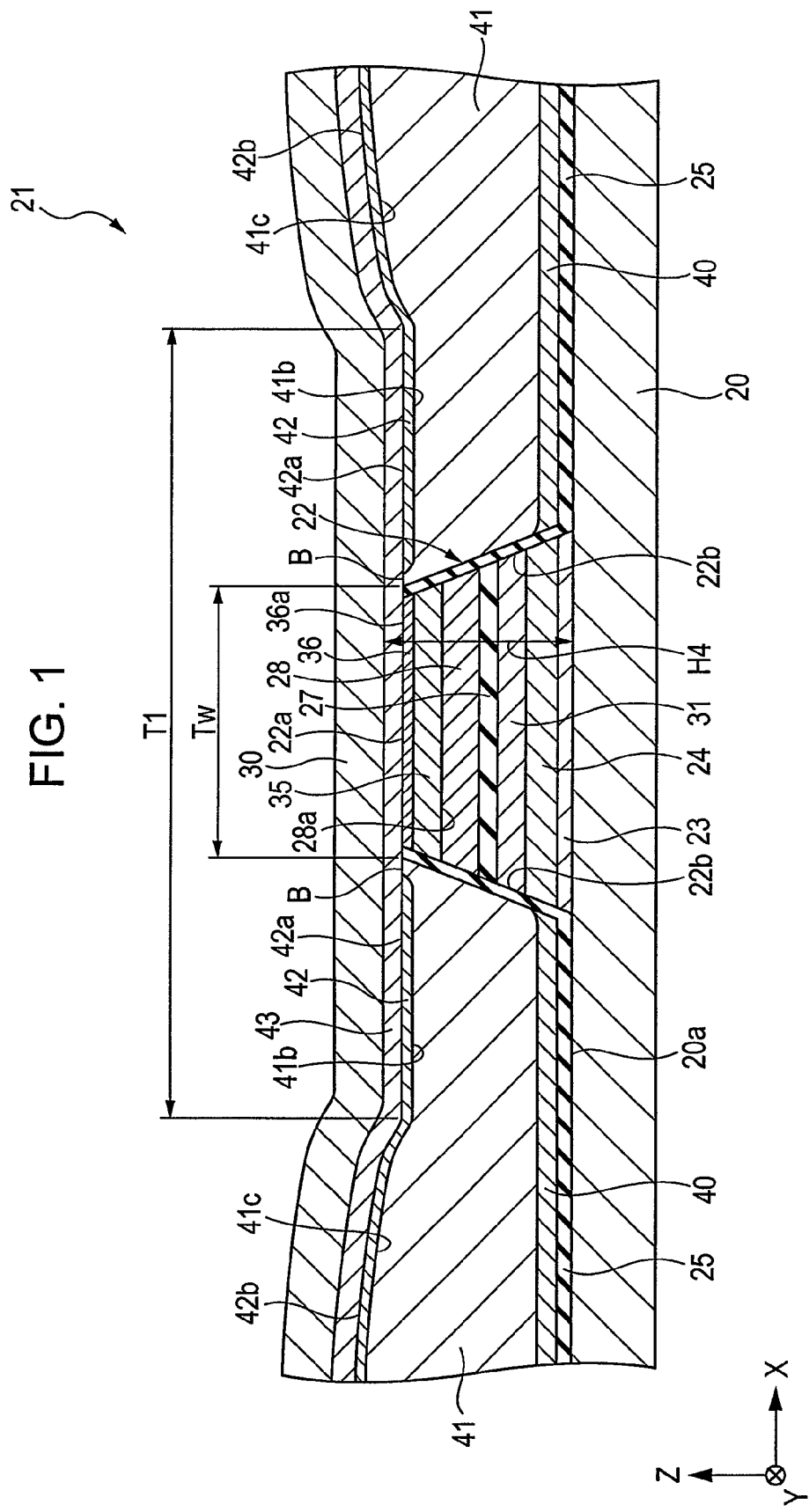
FIG. 1 is a fragmentary cross-sectional view of a tunneling magnetic sensing element, the view being taken along a plane parallel to a face facing a recording medium.

FIG. 1 is a fragmentary cross-sectional view of a tunneling magnetic sensing element, the view being taken along a plane parallel to a face facing a recording medium.

A tunneling magnetic sensing element is disposed at a trailing end of a floating slider included in a hard disk system and detects a magnetic field recorded in a hard disk or the like. In FIG. 1, the X direction indicates a track width direction. The Y direction indicates the direction of a magnetic leakage field from a magnetic recording medium (height direction). The Z direction indicates the direction of motion of a magnetic recording medium such as a hard disk and also indicates the stacking direction of layers in the tunneling magnetic sensing element. The X, Y, Z directions are at right angles to one another. The X-Z plane is the plane parallel to the face facing the recording medium.

A bottom shield layer 20 is composed of a magnetic material such as a NiFe alloy.

The top face 20a of the bottom shield layer 20 is used for forming a tunneling magnetic sensing element 21. A laminate 22 constituting the tunneling magnetic sensing element 21 is disposed on the top face 20a.

The lowermost layer of the laminate 22 is a seed layer 23. The seed layer 23 is composed of NiFeCr, Cr, or the like. The seed layer 23 composed of NiFeCr has a face-centered cubic (fcc) structure. Equivalent crystal planes each expressed as the {111} plane are dominantly oriented in the direction parallel to the surface of the seed layer. Alternatively, the seed layer 23 composed of Cr has a body-centered cubic structure. Equivalent crystal planes each expressed as the {110} plane are dominantly oriented in the direction parallel to the surface of the seed layer. An underlying layer (not shown) may be disposed below the seed layer 23. The underlying layer is composed of at least one nonmagnetic material selected from the group consisting of Ta, Hf, Nb, Zr, Ti, Mo, and W.

An antiferromagnetic layer 24 is disposed on the seed layer 23. The antiferromagnetic layer 24 is preferably composed of X—Mn (wherein X represents at least one element selected from Pt, Pd, Ir, Rh, Ru, and Os). Alternatively, the antiferromagnetic layer 24 in the present invention may be composed of an X—Mn—X' alloy (wherein X' represents at least one element selected from Ne, Ar, Kr, Xe, Be, B, C, N, Mg, Al, Si, Pt, V, Cr, Fe, Co, Ni, Cu, Zn, Ga, Ge, Zr, Nb, Mo, Ag, Cd, Sn, Hf, Ta, W, Re, Au, Pb, and rare-earth elements).

A pinned magnetic layer 31 is disposed on the antiferromagnetic layer 24. The pinned magnetic layer 31 is composed of a magnetic material, such as a CoFe alloy, a NiFe alloy, Co, or a CoNeNi alloy. Nonlimiting examples of the structure of the pinned magnetic layer 31 include a single-layer structure, a structure in which a plurality of magnetic layers are laminated, and a laminated ferrimagnetic structure in which a nonmagnetic layer is disposed between magnetic layers.

An exchange coupling magnetic field is generated by heating between the pinned magnetic layer 31 and the antiferromagnetic layer 24 to fix the magnetization of the pinned magnetic layer 31 in the height direction (Y direction).

An insulating barrier layer 27 is disposed on the pinned magnetic layer 31. The insulating barrier layer 27 is composed of $Al_2O_3$, $TiO_x$, $MgO_x$, $Ti_2O_5$, $TiO_2$ or the like.

A free magnetic layer 28 is disposed on the insulating barrier layer 27. The free magnetic layer 28 is composed of a NiFe alloy, a CoFeNi alloy, a CoFe alloy, or the like. For example, preferably, the free magnetic layer 28 is composed of a NiFe alloy, and a diffusion barrier layer composed of Co, a CoFe alloy, or the like is disposed between the free magnetic layer 28 and the insulating barrier layer 27. Nonlimiting examples of the structure of the free magnetic layer 28 include a single-layer structure, a structure in which a plurality of magnetic layers are laminated, and a laminated ferrimagnetic structure in which a nonmagnetic layer is disposed between magnetic layers.

An interlayer 35 is disposed on the free magnetic layer 28. A first reactive-ion-etching (RIE) stop layer 36 is disposed on the interlayer 35. The interlayer 35 suppresses a deterioration in the magnetic properties of the free magnetic layer 28, compared with the case where the first RIE stop layer 36 is disposed directly on the free magnetic layer 28. The term "deterioration in magnetic properties" defined here refers to, for example, a decrease in the rate of change of magnetic resistance. Such a deterioration in magnetic properties reduces the stability of the magnetization of the free magnetic layer 28, thereby causing problems such as a reduction in read output. However, since the interlayer 35 is disposed between the free magnetic layer 28 and the first RIE stop layer 36 as shown in FIG. 1, the deterioration in the magnetic properties of the free magnetic layer 28 is appropriately suppressed. The interlayer 35 is also used for, for example, adjusting the distance H4 between the bottom shield layer 20 and a top shield layer 30; and for adjusting the difference in height between the top face 41*b* of a hard bias layer 41 at each side of the laminate 22 in the track width direction (X direction) and the top face 28*a* of the free magnetic layer 28.

The interlayer 35 is preferably composed of a nonmagnetic material and particularly preferably composed of a nonmagnetic conductive material. The interlayer 35 composed of an insulating material impairs the read characteristics of a CPP-mode magnetic sensing element because a current cannot appropriately pass through the interlayer 35. Alternatively, the interlayer 35 composed of a magnetic material disadvantageously functions like the free magnetic layer 28 to further degrade the magnetic properties of the free magnetic layer 28, which is not preferable.

The interlayer 35 is preferably composed of at least one element selected from Ta, Ru, Cu, W, and Rh. The interlayer 35 may have a single-layer structure or a multilayer structure. Consequently, the interlayer 35 appropriately suppress the deterioration in the magnetic properties of the free magnetic layer 28.

The first RIE stop layer 36 on the interlayer 35 functions as a stop layer for reactive ion etching (RIE). Reactive ion etching is employed in a step of removing a reactive-ion-etching-controlling layer (RIE-controlling layer) disposed on the first RIE stop layer 36 in a production process as described below.

Thus, the etch rate of the first RIE stop layer 36 in reactive ion etching is lower than that of the RIE-controlling layer. Furthermore, the etch rate of the first RIE stop layer 36 in reactive ion etching is also lower than those of the other layers constituting the laminate 22.

As shown in FIG. 1, the top face 22*a* of the laminate 22 is a planarized surface. The top face 22*a* of the laminate 22 is identical to the top face 36*a* of the first RIE stop layer 36.

The first RIE stop layer 36 is preferably composed of a nonmagnetic material and particularly preferably composed of a nonmagnetic conductive material. The first RIE stop layer 36 composed of an insulating material impairs the read output of a CPP-mode magnetic sensing element because a current cannot appropriately pass through the first RIE stop layer 36. Alternatively, the first RIE stop layer 36 composed of a magnetic material disadvantageously functions like part of the free magnetic layer 28 to significantly affect a tunneling magnetoresistance effect, which is not preferable. The first RIE stop layer 36 is preferably composed of at least one element selected from Cr, Pt, Ir, Ru, Rh, Pd, and Ag.

As shown in FIG. 1, side end faces 22*b* and 22*b* of the laminate 22 in the track width direction (X direction) are inclined. The width of the laminate 22 in the track width direction gradually decreases with height (Z direction). An underlying insulating layer 25 is disposed on each side end face 22*b* of the laminate 22 and on the top face 20*a* of the bottom shield layer 20 at each side of the laminate 22 in the track width direction (X direction).

An underlying bias layer 40 is disposed on each underlying insulating layer 25 on the bottom shield layer 20. The underlying bias layer 40 is composed of Cr, CrTi, Ta/CrTi, or the like. The underlying bias layers 40 improve magnetic properties, such as coercive force Hc and a squareness ratio S, of the hard bias layers 41.

The hard bias layer 41 is disposed on each underlying insulating layer 25 and each underlying bias layer 40. The hard bias layers 41 are each composed of a CoPt alloy, a CoCrPt alloy, or the like. The hard bias layers 41 apply a bias magnetic field to the free magnetic layer 28. The magnetization of the free magnetic layer 28 is oriented in the track width direction (X direction) by the bias magnetic field.

A second reactive-ion-etching (RIE) stop layer 42 is disposed on the top face 41*b* and the top face 41*c* of each hard bias layer 41. The second RIE stop layers 42 function as stop layers for reactive ion etching (RIE). Reactive ion etching is employed in a step of removing a milling stop layer disposed on each second RIE stop layer 42 in a production process as described below. Thus, the etch rate of each second RIE stop layer 42 in reactive ion etching is lower than that of each milling stop layer. Furthermore, the etch rate of each second RIE stop layer 42 in reactive ion etching is also lower than that of each hard bias layer 41.

As shown in FIG. 1, the top face 41*b* of each hard bias layer 41 is a planarized surface. The top face 41*b* of each hard bias layer 41 is disposed at a position slightly lower than that of the top face 22*a* of the laminate 22. The top face 41*c* of each hard bias layer 41 away from the laminate 22 in the track width direction (X direction) is not a planarized surface but a ridged surface unlike the top face 41*b*. The hard bias layer 41 having a small thickness in the direction parallel to the track width direction and the underlying insulating layer 25 are disposed at each region located between the corresponding second RIE stop layer 42 and the laminate 22. A top face B of each region is a continuous, planarized surface of the corresponding hard bias layer 41 and underlying insulating layer 25. The top faces B are disposed at the same height as the top face 22*a* of the laminate 22.

As shown in FIG. 1, the top face 42a of each second RIE stop layer 42 on the top face 41b of the corresponding hard bias layer 41 is a planarized surface. The top faces 42a, the top face 22a of the laminate 22, and top faces B are disposed at the same height. The top face 42b of each second RIE stop layer 42 on the top face 41c of the corresponding hard bias layer 41 is a curved surface as is the top face 41c.

The second RIE stop layer 42 is preferably composed of the same material as that of the first RIE stop layer 36. The second RIE stop layer 42 is preferably composed of at least one element selected from Cr, Pt, Ir, Ru, Rh, Pd, and Ag.

As shown in FIG. 1, a constant-height planarized surface extends over the top face 22a of the laminate 22, the top faces B, and the top faces 42a of the second RIE stop layers 42 in the track width direction (X direction). The width T1 of the planarized surface in the track width direction is 2 to 20 times the track width Tw of the laminate 22, the track width Tw being regulated by the width of the top face 28a of the free magnetic layer 28 in the track width direction.

As shown in FIG. 1, an adjusting layer 43 for adjusting the distance between the shield layers is composed of a nonmagnetic conductive material and disposed over the top face 22a of the laminate 22, the top faces B, the top faces 42a and 42b of the second RIE stop layers 42. The adjusting layer 43 is composed of at least one element selected from, for example, Ta, Mo, W, and Ti. The adjusting layer 43 may have a single-layer structure or a multilayer structure. For example, the adjusting layer 43 is composed of tantalum (Ta) and has a single-layer structure. The adjusting layer 43 is disposed in order to adjust the distance H4 between the shield layers. Therefore, if, in particular, the distance H4 between the shield layers can be adjusted without the adjusting layer 43, the adjusting layer 43 is not necessary.

In an embodiment shown in FIG. 1, the top shield layer 30 is disposed on the adjusting layer 43. The top shield layer 30 is composed of a magnetic material such as a NiFe alloy.

In a tunneling magnetic sensing element shown in FIG. 1, the bottom shield layer 20 and the top shield layer 30 also function as electrodes. A current passes from the bottom shield layer 20 and the top shield layer 30 to the laminate 22 in the direction parallel to the Z direction (i.e., in the direction perpendicular to the surfaces of the layers constituting the laminate 22). The magnitude of the tunneling current passing through the laminate 22 varies depending on the correlation between the magnetization directions of the pinned magnetic layer 31 and the free magnetic layer 28.

When an external magnetic field enters the tunneling magnetic sensing element from the Y direction, the magnetization of the free magnetic layer 28 is changed by the effect of the external magnetic field. As a result, the magnitude of the tunneling current is also changed. The change in current is detected as a change in electric resistance. The change in electric resistance is converted into a change in voltage. In this way, the external magnetic field from a recording medium is detected.

The advantages of this embodiment will be described below. In this embodiment, the first RIE stop layer 36 is disposed as the uppermost layer of the laminate 22. The second RIE stop layers 42 are disposed on the top faces 41b of the hard bias layers 41. The first RIE stop layer 36 and the second RIE stop layers 42 function as stop layers for reactive ion etching (RIE). In accordance with a process, described below, for producing a tunneling magnetic sensing element according to this embodiment, the planarized top face 22a of the laminate 22 (i.e., the planarized top face 36a of the first RIE stop layer 36) is disposed at a height closer to that of the planarized top faces 42a of the second RIE stop layers 42 compared with a known art. Most preferably, the planarized top face 22a of the laminate 22 (i.e., the planarized top face 36a of the first RIE stop layer 36), the planarized top faces 42a of the second RIE stop layers 42, and the planarized top faces B are disposed at the same height.

Furthermore, in this embodiment, the irregularities of the top faces B and the top faces 42a of the second RIE stop layers 42 at both sides of the laminate 22 in the track width direction are small. Therefore, the centerline average roughness (Ra) is lower than that in the known art.

Consequently, it is possible to produce a read head including the tunneling magnetic sensing element 21 having a small variation in the distance H4 between the shield layers in a wide range (in the range of the width T1 shown in FIG. 1) in the track width direction (X direction) and having excellent read characteristics.

In this embodiment, the first RIE stop layer 36 and the second RIE stop layer 42 are preferably composed of the same material. This achieves the same etch rate of the first RIE stop layer 36 and the second RIE stop layer 42 in reactive ion etching. For example, the first RIE stop layer 36 and the second RIE stop layer 42 are composed of chromium (Cr). This facilitates control of the etch rate, reduces the step height between the top face 36a of the first RIE stop layer 36 and the top face 42a of the second RIE stop layer 42, and appropriately reduces the variation in the distance H4 between the shield layers, as compared with those in the known art.

Although the tunneling magnetic sensing element is described in this embodiment, a current-perpendicular-to-plane-mode giant magnetoresistive element (CPP-mode GMR element) including a nonmagnetic conductive layer composed of, for example, copper (Cu) in place of the insulating barrier layer 27 may be included in an embodiment.

That is, this embodiment may be effectively applied to a magnetic sensing element operating in the CPP mode. For a magnetic sensing element operating in a current-in-plane mode (CIP mode), a current is diverted to the interlayer 35 and the first RIE stop layer 36 to markedly reduce read output. Thus, application of the laminate 22 shown in FIG. 1 to such a magnetic sensing element operating in the CIP mode markedly reduces read output, which is not preferable.

In the embodiment shown in FIG. 1, the interlayer 35 and the first RIE stop layer 36 are laminated on the free magnetic layer 28. A structure in which the first RIE stop layer 36 is disposed directly on the free magnetic layer 28 is another embodiment of the present invention.

In this embodiment, the laminate 22 is required to include at least the pinned magnetic layer 31, the insulating barrier layer 27, the free magnetic layer 28, and the first RIE stop layer 36. For example, the antiferromagnetic layer 24 is not necessarily required.

Figure 2:
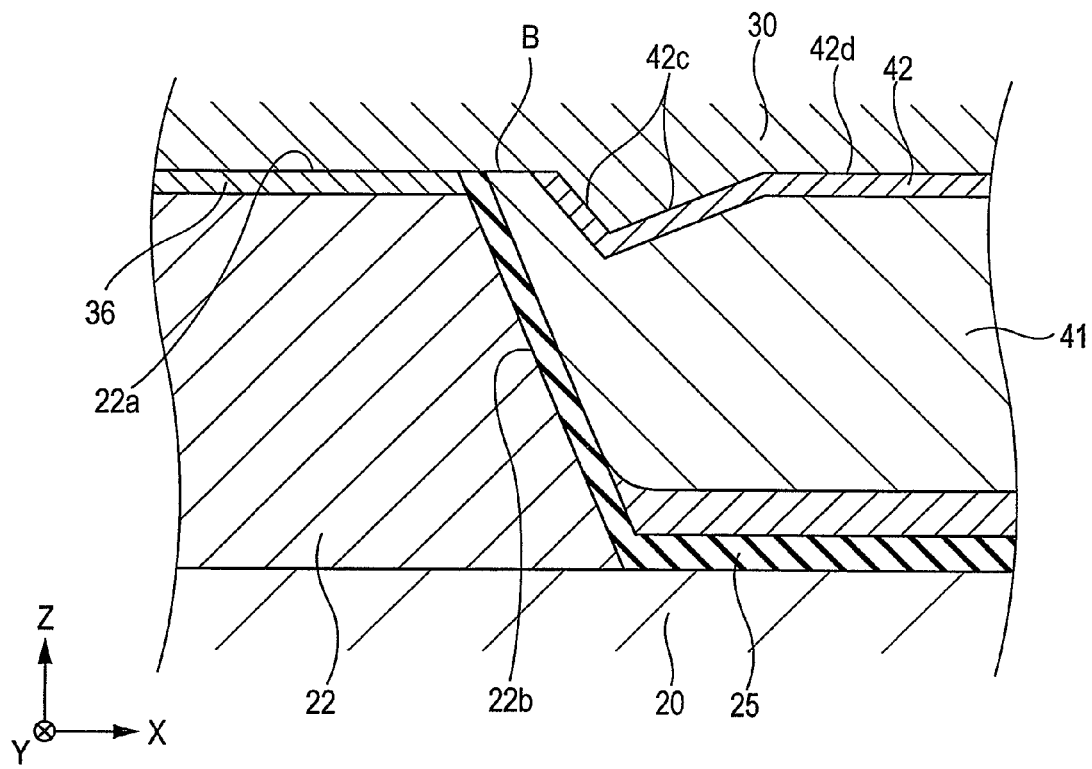
FIG. 2 is a fragmentary enlarged cross-sectional view of a tunneling magnetic sensing element, the view being taken along a plane parallel to a face facing a recording medium.

FIG. 2 is a fragmentary enlarged cross-sectional view of a tunneling magnetic sensing element that illustrates that the shape of the top face of the second RIE stop layer is different from that in FIG. 1. The view is taken along a plane parallel to a face facing a recording medium.

As shown in FIG. 2, the top face of the second RIE stop layer 42 includes a depressed surface 42c near the laminate 22 and a planarized surface 42d continuing to the depressed surface 42c and extending in the track width direction away from the laminate 22. The planarized surface 42d and the top face 22a of the laminate 22 are preferably disposed at the same height. In the embodiment shown in FIG. 2, the uneven surface is disposed between the top face 22a of the laminate 22 and the planarized surface 42d of the second RIE stop layer 42. At least part of the top face of the second RIE stop layer 42 is preferably a planarized surface. The planarized surface 42d and top face 22a of the laminate 22 are preferably disposed at the same height. Most preferably, as shown in FIG. 1, the planarized top face 22a of the laminate 22, the planarized top faces 42a of the second RIE stop layers 42, and the planarized top faces B each between the laminate 22 and the corresponding second RIE stop layer 42 are disposed at the same height, and these planarized top faces are continuously disposed.

A process for producing the tunneling magnetic sensing element shown in FIG. 1 will be described below with reference to the drawings. FIGS. 3 to 9 show a process for producing the tunneling magnetic sensing element and are each a fragmentary cross-sectional view taken along a plane parallel to a face facing a recording medium.

Figure 3:
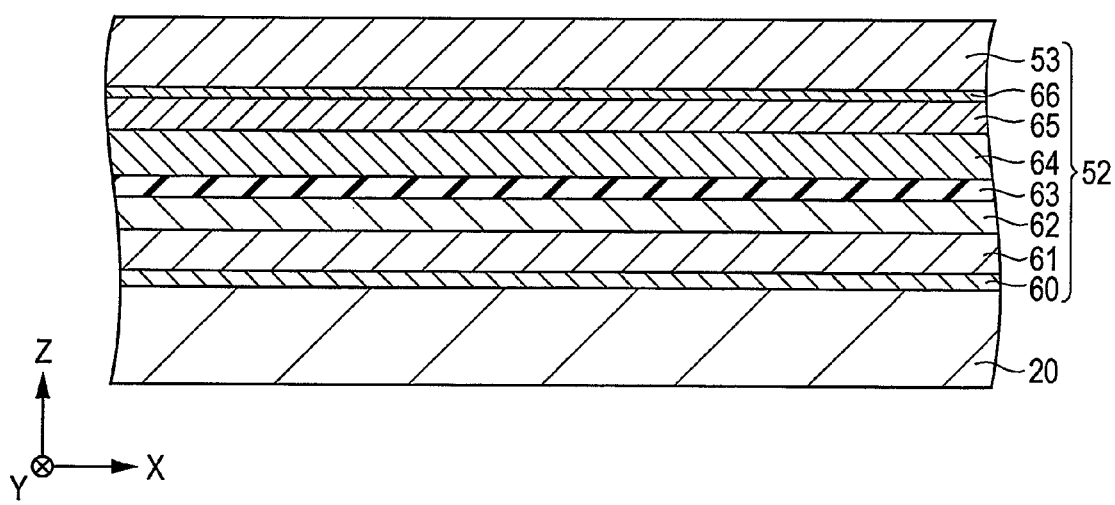
FIG. 3 is a fragmentary cross-sectional view of a tunneling magnetic sensing element during a production process, the view being taken along a plane parallel to a face facing a recording medium.

In a step shown in FIG. 3, a laminate 52 is formed on the bottom shield layer 20, the laminate including a seed layer 60, an antiferromagnetic layer 61, a pinned magnetic layer 62, an insulating barrier layer 63, a free magnetic layer 64, an interlayer 65, a first RIE stop layer 66, and a RIE-controlling layer 53, formed in that order.

For materials used in the layers from the bottom shield layer 20 to the first RIE stop layer 66, refer to the descriptions of FIG. 1. The RIE-controlling layer 53 is composed of a material such that the etch rate of the material is higher than that of the first RIE stop layer 66 at least in reactive ion etching. Furthermore, the RIE-controlling layer 53 is preferably composed of a material such that the milling rate of the material is lower than that of the first RIE stop layer 66 in ion milling. For example, the RIE-controlling layer 53 is composed of at least one element selected from Ta, Mo, W, and Ti. The interlayer 65 having a thickness of about 10 to 60 Å is formed. The first RIE stop layer 66 having a thickness of about 30 to 70 Å is formed. The RIE-controlling layer 53 having a thickness of about 200 to 600 Å is formed. As shown in FIG. 2, the thickness of the RIE-controlling layer 53 is higher than those of the first RIE stop layer 66 and the interlayer 65. For example, the first RIE stop layer 36 and the interlayer 35 each have a thickness of 50 Å, and the RIE-controlling layer 53 has a thickness of 200 Å.

Figure 4:
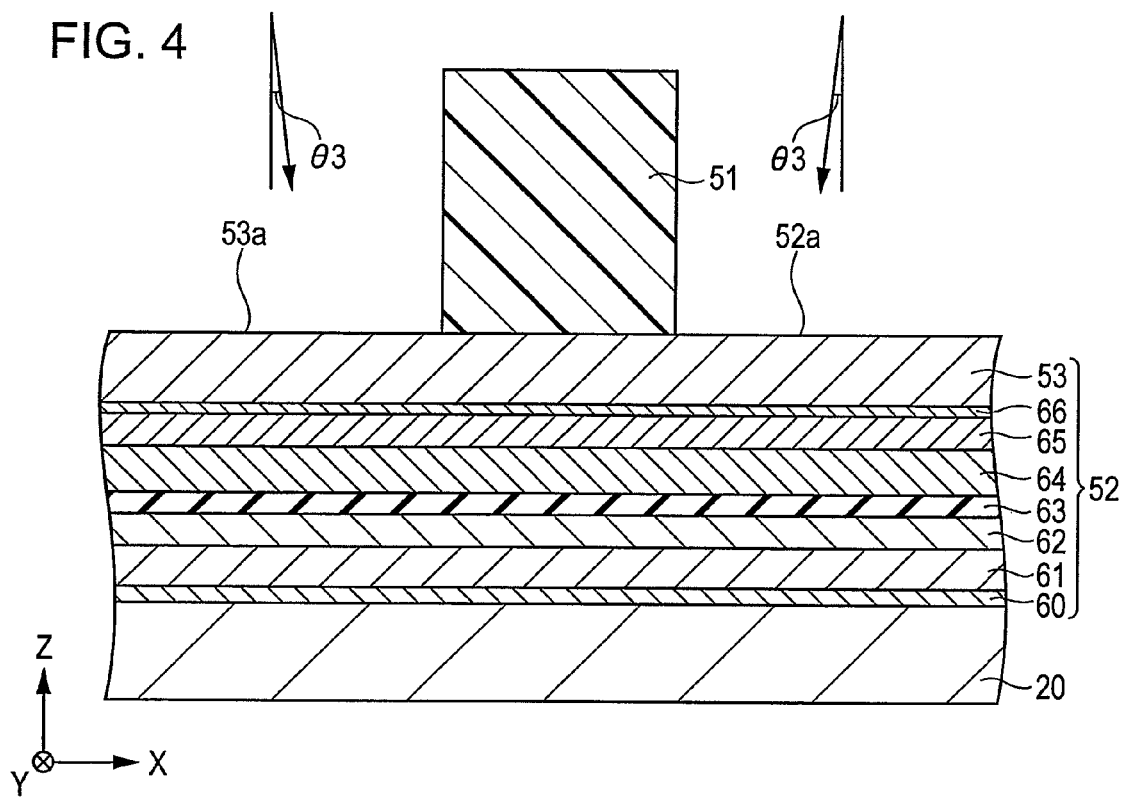
FIG. 4 is a process drawing (cross-sectional view) showing a step subsequent to a step in FIG. 3.
Figure 5:
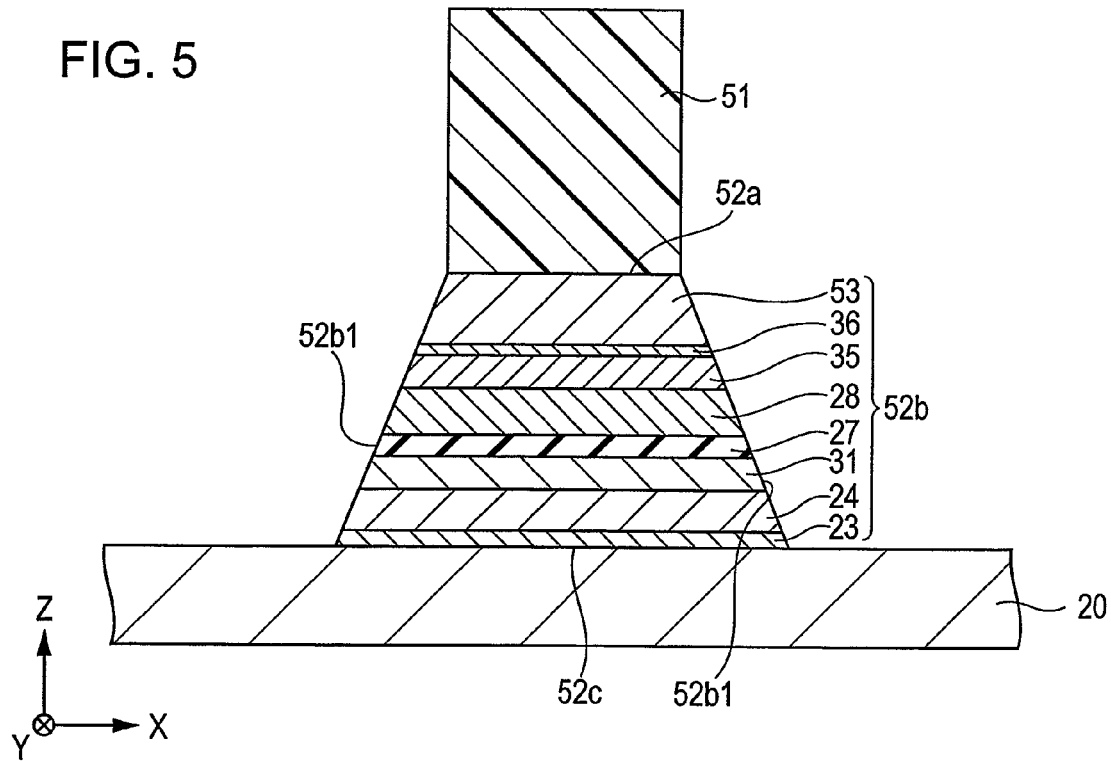
FIG. 5 is a process drawing (cross-sectional view) showing a step subsequent to the step in FIG. 4.

In a step shown in FIG. 4, a resist layer 51 is formed on the top face 52a of the laminate 52 (i.e., the top face 53a of the RIE-controlling layer 53) and is then shaped into a predetermined shape by exposure and development. As shown in FIG. 5, portions of the laminate 52 not covered with the resist layer 51 are removed by ion milling. A milling angle θ3 (an angle to the direction parallel to the height direction (Z direction)) is adjusted in such a way that a milling rate at the milling angle θ3 is higher than that at a milling angle θ2 in a step shown in FIG. 7 described below. Furthermore, the milling angle θ3 is preferably smaller than the milling angle θ2 in the step shown in FIG. 7. The laminate 52 is preferably etched by ion milling from a direction as nearly perpendicular as possible to the laminate 52 so as to suitably remove the portions of the laminate 52 not covered with the resist layer 51. Specifically, the milling angle θ3 is set in the range of 0° to 20°.

Figure 16:
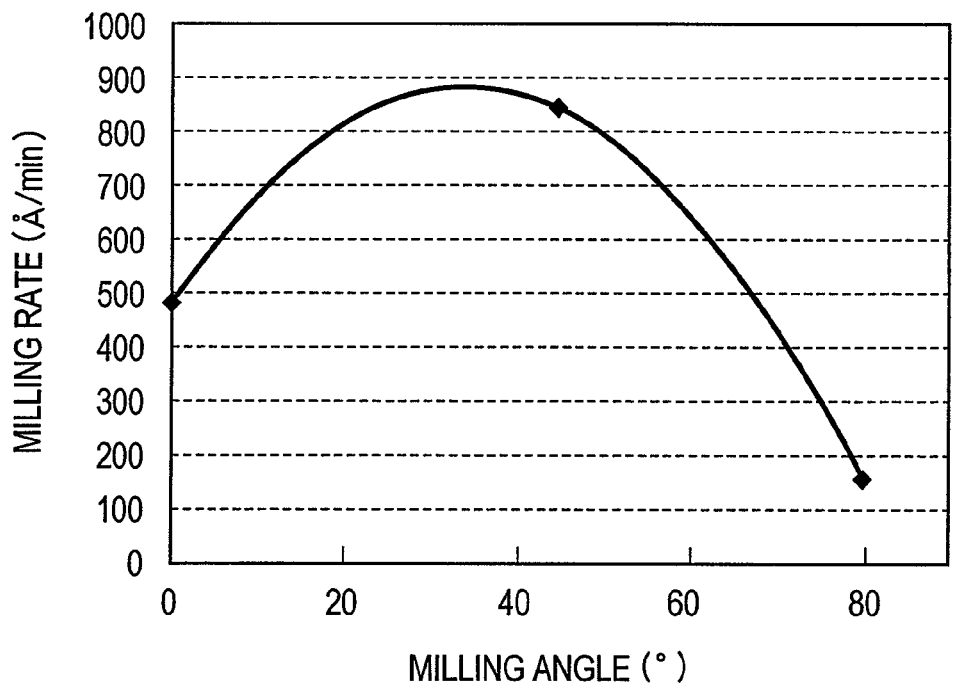
FIG. 16 is a graph showing the relationship between the milling angle and the milling rate for tantalum.

FIG. 16 is a graph showing the relationship between the milling angle and the milling rate for tantalum (Ta). As shown in FIG. 16, when the milling angle is set in the range of 0° to 20°, the milling rate increases to about 500 to 800 Å/min. Thus, the RIE-controlling layer 53 composed of, for example, tantalum (Ta) can be appropriately removed.

After this ion milling step, a laminate 52b having a shape shown in FIG. 5 is left below the resist layer 51. In a step shown in FIG. 5 and the subsequent steps, the layers from the seed layer to the first RIE stop layer in the laminate 52 correspond to the respective layers from the seed layer 23 to the first RIE stop layer 36 shown in FIG. 1. Thus, the reference numerals of the layers from the seed layer to the first RIE stop layer in the step shown in FIG. 5 and the subsequent steps correspond to those in FIG. 1.

In the laminate 52b, side end faces 52b1 and 52b1 are inclined. The width of the laminate 52b in the X direction gradually increases from the top face 52a toward the bottom face 52c of the laminate 52b.

Spatters generated by removing the laminate 52 adhere to the surface of the resist layer 51. The adhering spatters are removed by ion milling or the like. This step may be omitted.

Figure 6:
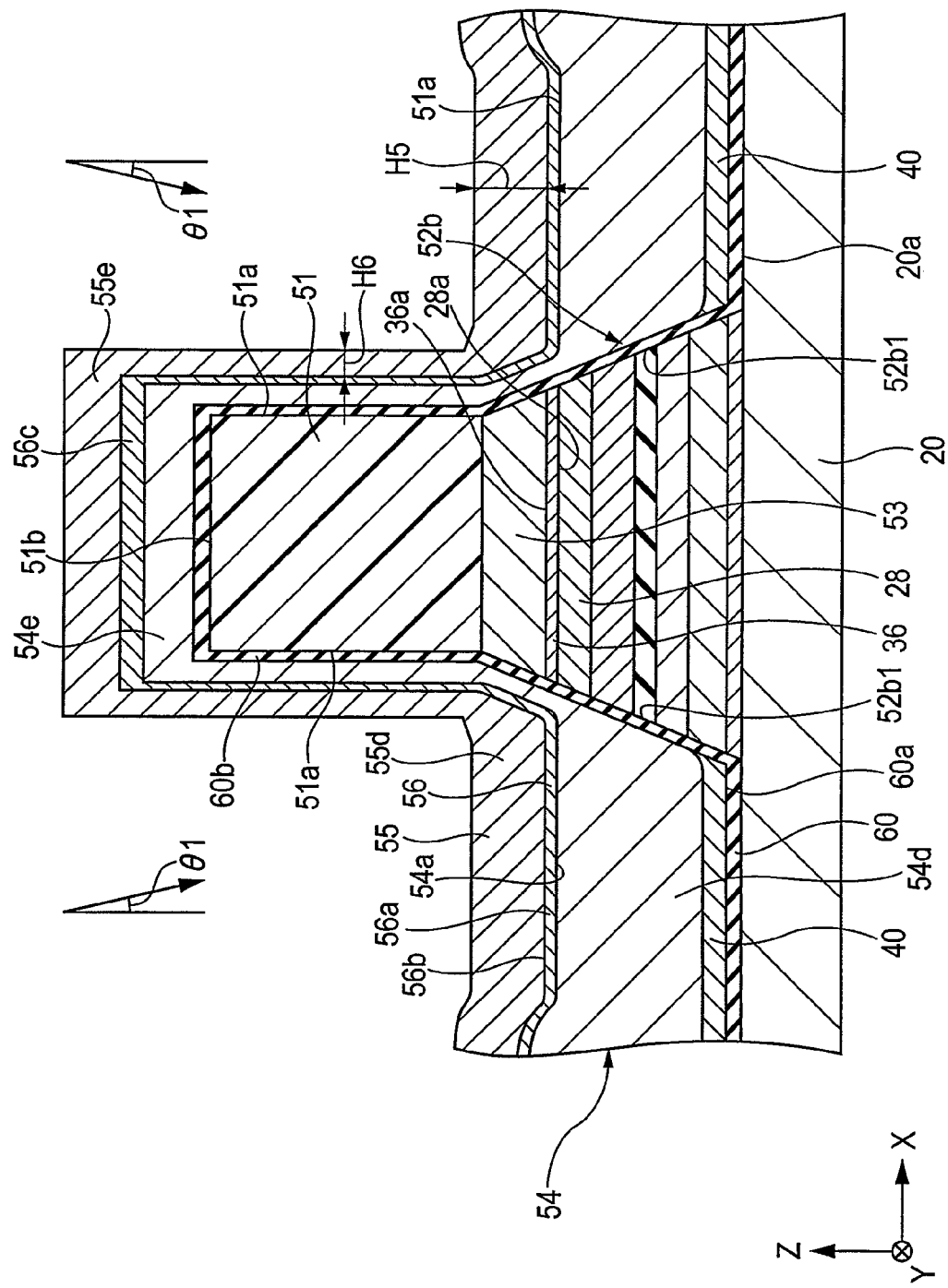
FIG. 6 is a process drawing (cross-sectional view) showing a step subsequent to the step in FIG. 5.
Figure 10:
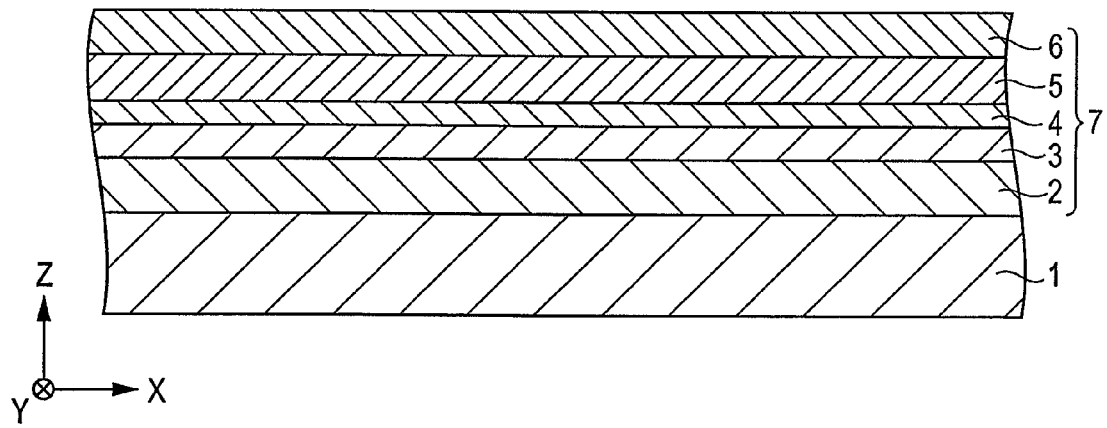
FIG. 10 is a fragmentary cross-sectional view of a known tunneling magnetic sensing element during a production process, the view being taken along a plane parallel to a face facing a recording medium.
Figure 11:
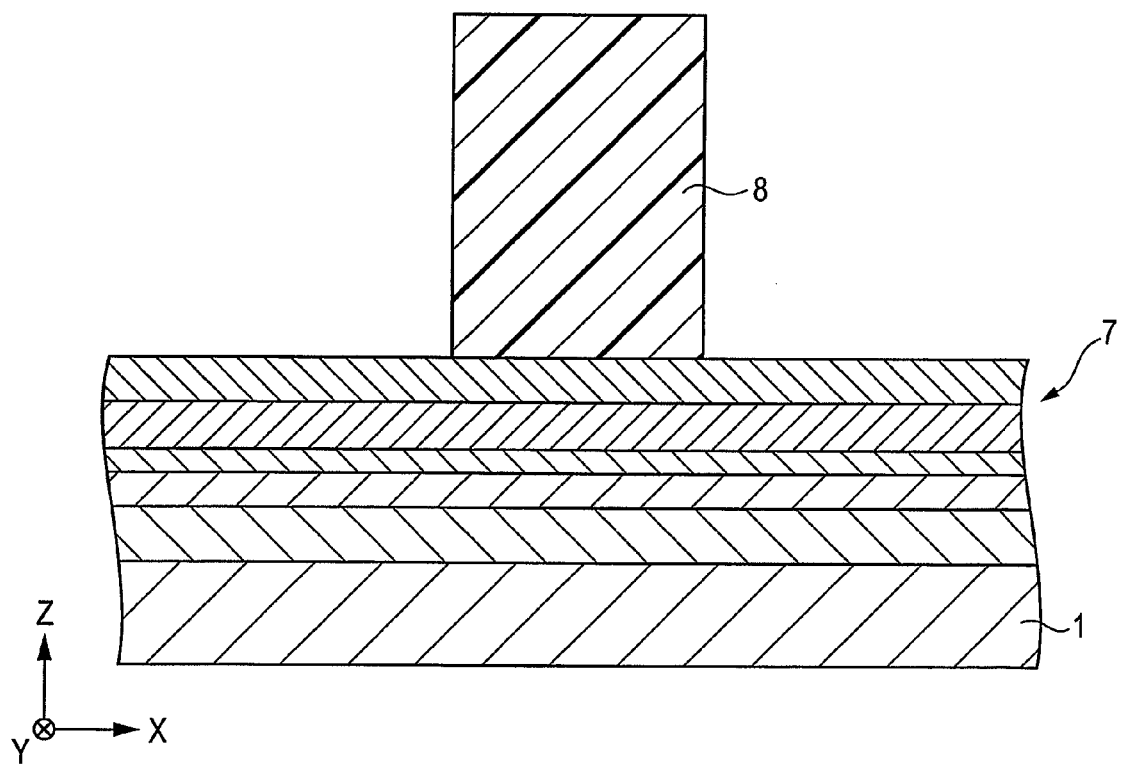
FIG. 11 is a process drawing (cross-sectional view) showing a step subsequent to a step in FIG. 10.
Figure 12:
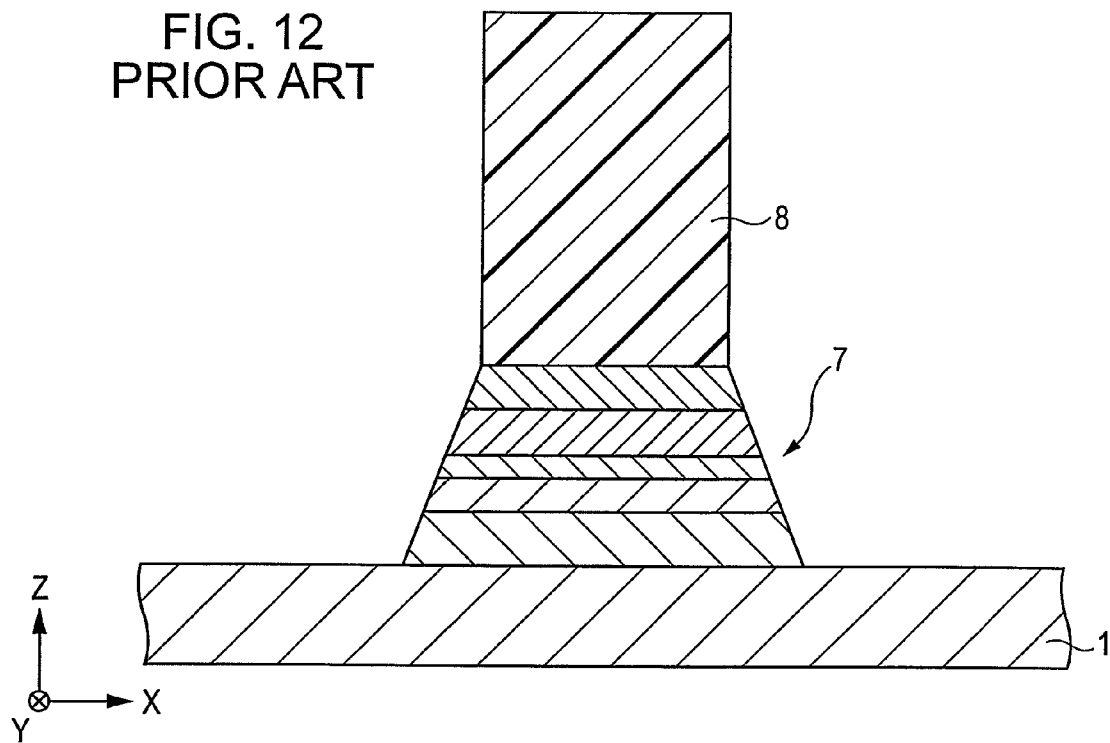
FIG. 12 is a process drawing (cross-sectional view) showing a step subsequent to the step in FIG. 11.
Figure 13:
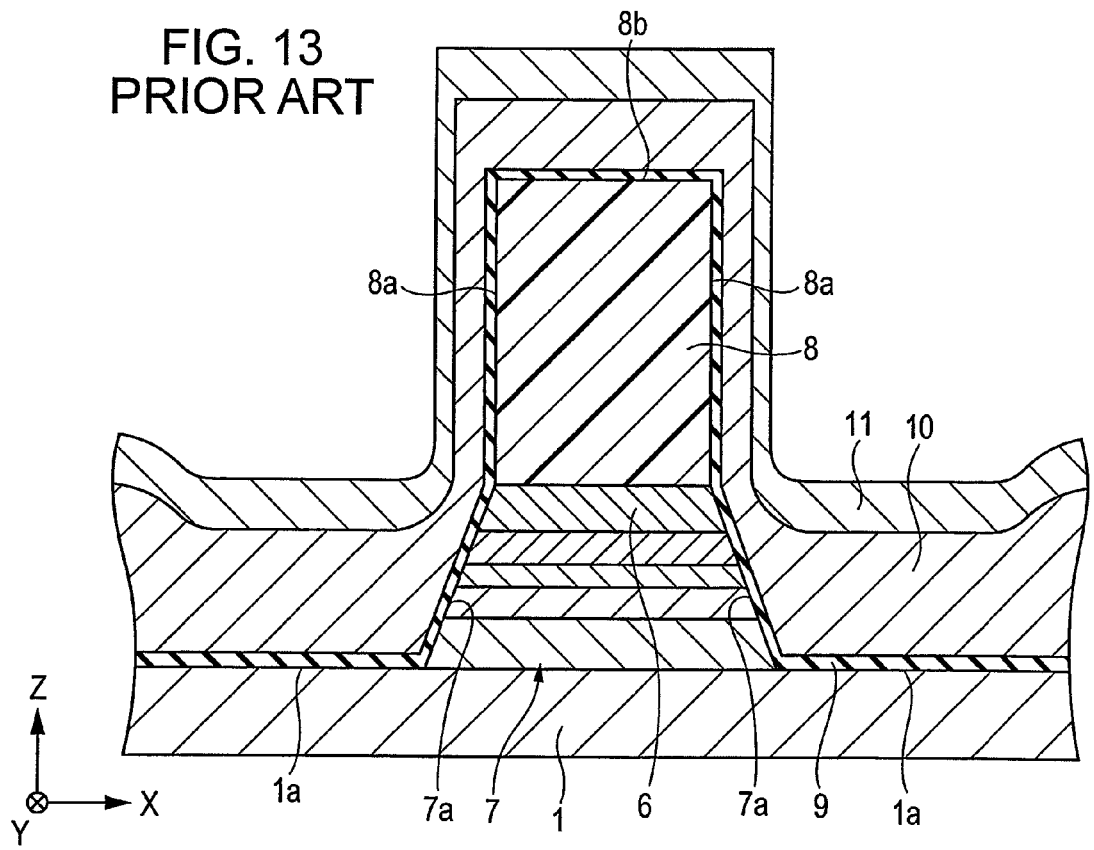
FIG. 13 is a process drawing (cross-sectional view) showing a step subsequent to the step in FIG. 12.
Figure 14:
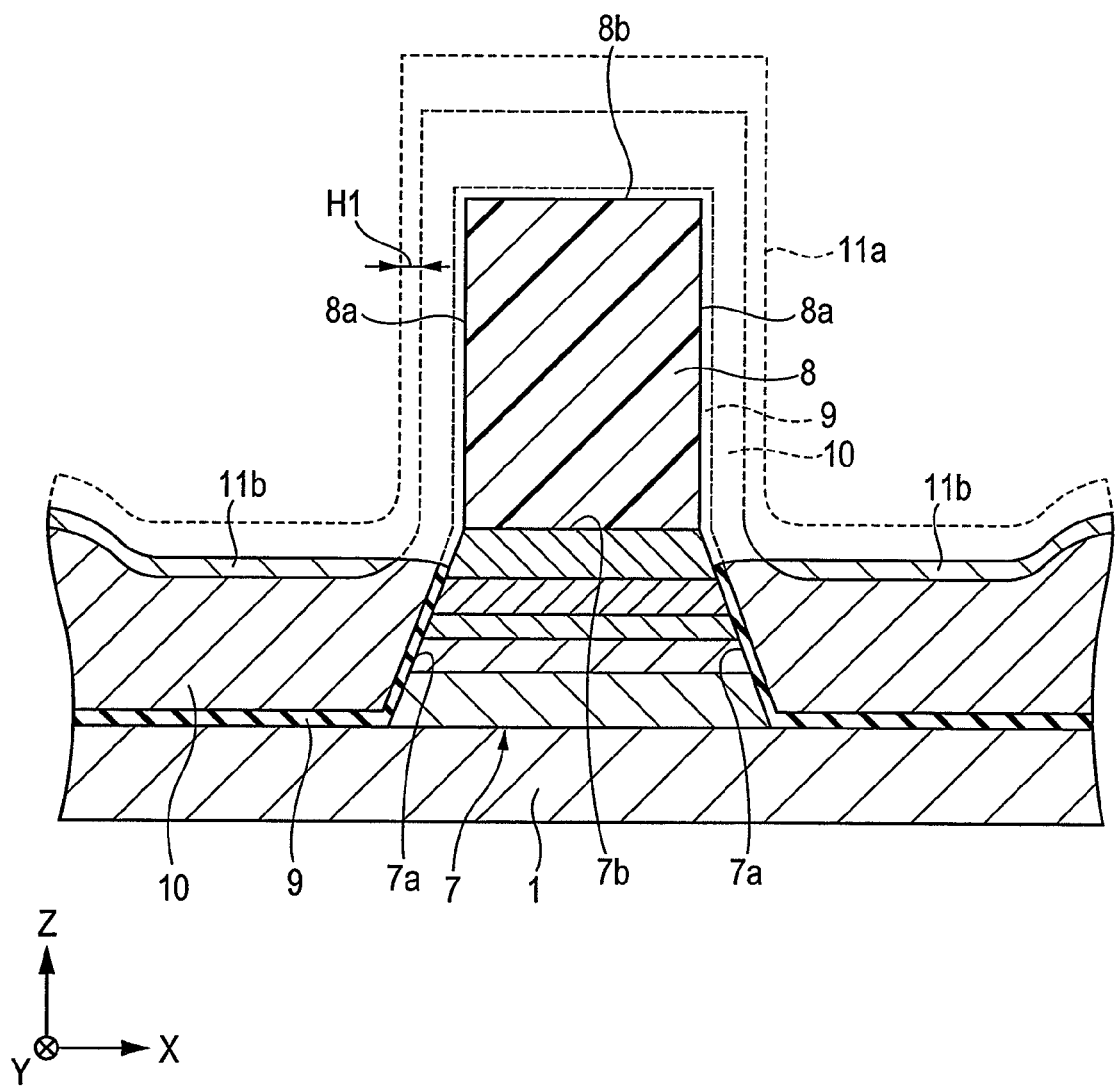
FIG. 14 is a process drawing (cross-sectional view) showing a step subsequent to the step in FIG. 13.
Figure 15:
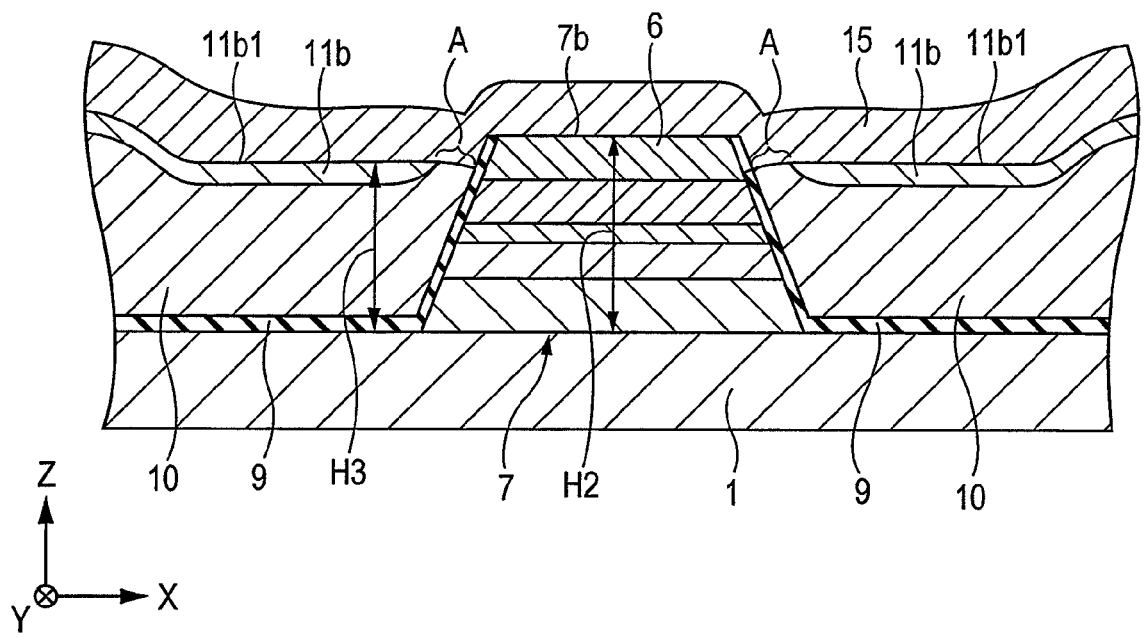
FIG. 15 is a process drawing (cross-sectional view) showing a step subsequent to the step in FIG. 14.

In a step shown in FIG. 6, an underlying insulating layer 60 is formed by, for example, ion beam deposition (IBD) over the top face 20a of the bottom shield layer 20, the side end faces 52b1 and 52b1 of the laminate 52b in the track width direction (X direction), the side end face 51a and 51a of the resist layer 51, and the top face 51b of the resist layer 51.

For example, preferably, the underlying insulating layer 60 is composed of a compound selected from $Si_3N_4$, WO, and $Al_2O_3$ and has a single-layer structure or a multilayer structure. The underlying insulating layer 60 is also disposed on the front end face of the resist layer 51 facing a recording medium (face facing toward the direction opposite to the Y direction) and the rear end face of the resist layer 51 (face facing toward the Y direction). That is, the underlying insulating layer 60 is disposed on the entire surface of the resist layer 51 except for the bottom face of the resist layer 51.

For convenience of explanation, portions of the underlying insulating layer 60 disposed over the top face 20a of the bottom shield layer 20 and the side end faces 52b1 of the laminate 52b are referred to as "underlying insulating layers 60a". The portion of the underlying insulating layer 60 disposed on the surface of the resist layer 51 is referred to as an "on-resist underlying insulating layer 60b".

The underlying bias layers 40 are formed on the underlying insulating layers 60a on the bottom shield layer 20. The underlying bias layers 40 are each composed of, for example, Cr, CrTi, or Ta/CrTi.

A hard bias layer 54 is formed over the underlying insulating layers 60a, the on-resist underlying insulating layer 60b, and the underlying bias layers 40 by ion beam deposition (IBD) or the like. The hard bias layer 54 is composed of, for example, a CoPt alloy or a CoCrPt alloy.

For convenience of explanation, portions of the hard bias layer 54 disposed on the underlying insulating layers 60a are referred to as "hard bias layers 54d". The portion of the hard bias layer 54 disposed on the on-resist underlying insulating layer 60b is referred to as an "over-resist hard magnetic layer 54e".

At least part of the top face 54a of each hard bias layer 54d above the corresponding underlying bias layer 40 is a planarized surface. In this step, the hard bias layers 54d are preferably formed while the thicknesses of the hard bias layers 54d are adjusted such that the top faces 54a of the hard bias layers 54 and the top face 28a of the free magnetic layer 28 are disposed at the same height (in the Z direction).

A second reactive-ion-etching (RIE) stop layer 56 is formed on the hard bias layers 54d and the over-resist hard magnetic layer 54e by, for example, ion beam deposition. For convenience of explanation, portions of the second RIE stop layer 56 disposed on the hard bias layers 54d are referred to as "second RIE stop layers 56b". The portion of the second RIE stop layer 56 disposed on the over-resist hard magnetic layer 54e is referred to as an "over-resist nonmagnetic layer 56c".

The second RIE stop layers 56b and the over-resist nonmagnetic layer 56c are each composed of a material such that the etch rate of the material is lower than that of a milling stop layer 55 over the second RIE stop layers 56b and the over-resist nonmagnetic layer 56c. The second RIE stop layers 56b and the over-resist nonmagnetic layer 56c are each composed of, for example, at least one element selected from the group consisting of Cr, Pt, Ir, Ru, Rh, Pd, and Ag.

The top faces 56a of the second RIE stop layers 56b disposed on the top faces 54a of the hard bias layers 54d are also each a planarized surface. Furthermore, the second RIE stop layers 56b are preferably formed while the thicknesses of the second RIE stop layers 56b are adjusted such that the top faces 56a of the second RIE stop layers 56 and the top face 36a of the first RIE stop layer 36 are disposed at the same height (in the Z direction).

The milling stop layer 55 is formed over the second RIE stop layers 56b and the over-resist nonmagnetic layer 56c by, for example, ion beam deposition. The milling stop layer 55 is composed of a material such that the etch rate of the material in reactive ion etching is higher than those of the second RIE stop layers 56b. Furthermore, the milling stop layer 55 is preferably composed of a material such that the milling rate of the material in ion milling is lower than those of the second RIE stop layers 56b. The milling stop layer 55 is composed of at least one element selected from the group consisting of Ta, Mo, W, and Ti.

For convenience of explanation, portions of the milling stop layer 55 disposed on the second RIE stop layers 56b are referred to as "milling stop layers 55d". The portion of the milling stop layer 55 disposed on the over-resist nonmagnetic layer 56c is referred to as an "over-resist nonmagnetic layer 55e".

Each of the milling stop layers 55d preferably has a thickness greater than that of each second RIE stop layer 56b. Each of the milling stop layers 55d preferably has a thickness greater than or equal to that of the RIE-controlling layer 53. Furthermore, the milling stop layers 55d and the RIE-controlling layer 53 are preferably composed of the same material. For example, the milling stop layers 55d and the RIE-controlling layer 53 are each composed of tantalum.

The on-resist underlying insulating layer 60b, the over-resist hard magnetic layer 54e, the over-resist nonmagnetic layer 56c, and the over-resist nonmagnetic layer 55e are disposed around the resist layer 51. Each of the layers around the resist layer 51 has a thickness smaller than that of the corresponding layer disposed at each side of the laminate 52b in the track width direction (X direction) on the top face 20a of the bottom shield layer 20. This is because a film-forming angle θ1 (an angle to the direction parallel to the height direction (Z direction)) is as close to zero as possible, in other words, this is because each layer is formed from a direction as nearly parallel as possible to the height direction (Z direction). For example, the film-forming angle θ1 is set in the range of about 20° to 40°. As a result, the on-resist underlying insulating layer 60b, the over-resist hard magnetic layer 54e, the over-resist nonmagnetic layer 56c, and the over-resist nonmagnetic layer 55e around the resist layer 51 each have a smaller thickness.

The on-resist underlying insulating layer 60b, the over-resist hard magnetic layer 54e, the over-resist nonmagnetic layer 56c, and the over-resist nonmagnetic layer 55e around the resist layer 51 are removed by ion milling. In a step shown in FIG. 7, the milling angle θ2 (angle to the direction parallel to the height direction (Z direction)) during ion milling is set to a value greater than that of the film-forming angle θ1. For example, the milling angle θ2 is set in the range of about 60° to 80°. As a result, the on-resist underlying insulating layer 60b, the over-resist hard magnetic layer 54e, the over-resist nonmagnetic layer 56c, and the over-resist nonmagnetic layer 55e around the resist layer 51 are appropriately removed by ion milling.

As shown in FIG. 7, after the ion milling step, the underlying insulating layers 60a are left on the top faces 20a of the bottom shield layer 20 and the side end faces 52b1 of the laminate 52b in the track width direction (X direction). The hard bias layers 54d are left on the underlying insulating layers 60a and the underlying bias layers 40. The second RIE stop layers 56b are left on the hard bias layers 54d. The milling stop layers 55d are left on the second RIE stop layers 56b. The top faces of the milling stop layers 55d on the second RIE stop layers 56b are located at positions 55a shown in FIG. 7 before the ion milling step. The top faces of the milling stop layers 55d are etched in the ion milling step. As a result, the top faces of the milling stop layers 55d are located at positions 55c after the ion milling step.

The milling stop layers 55d are each composed of, for example, tantalum. Although tantalum is not easily etched by ion milling, the milling stop layers 55d are also etched in the step of etching the unnecessary layers around the resist layer 51 by ion milling. As a result, the top face of each milling stop layer 55d descends from the position 55a to the position 55c. However, each of the milling stop layers 55d is not entirely removed. This is because the thickness H5 of each milling stop layer 55d (see FIG. 6) is markedly greater than the thickness H6 of the unnecessary over-resist nonmagnetic layer 55e around the resist layer 51, the thickness H6 being defined as a thickness in the direction parallel to the track width direction (X direction); and the milling angle θ2 is set to a value such that the milling rate is reduced in the ion milling step. The milling angle θ2 is preferably greater than the milling angle θ3 in the step shown in FIG. 4. In the step shown in FIG. 7, ion milling is preferably performed from a direction as oblique as possible because the unnecessary layers around the resist layer 51 can be appropriately removed. Specifically, the milling angle θ2 is set in the range of 60° to 80°. Thus, the milling rate of each milling stop layer 55d can be reduced. For example, the milling rate can be reduced to about 650 to 150 Å/min (see FIG. 16). More preferably, the milling angle θ2 is set in the range of 70° to 80° so that the milling rate is 500 Å/min or lower.

In this way, each of the milling stop layers 55d is not entirely removed by ion milling. That is, the milling stop layers 55d are appropriately left on the second RIE stop layers 56b even after ion milling.

The milling stop layers 55d function as protective layers for protecting the second RIE stop layers 56b from ion milling. Therefore, such milling stop layers 55d that are appropriately left can successfully protect the second RIE stop layers 56b from ion milling.

As shown in FIG. 7, the unnecessary layers around the resist layer 51 are removed to expose the resist layer 51. Then, the resist layer 51 is removed by dissolving the resist layer 51 in a dissolving solution. FIG. 8 shows the structure of the tunneling magnetic sensing element after removal of the resist layer 51.

As shown in FIG. 8, after removal of the resist layer 51, the RIE-controlling layer 53 is exposed. The RIE-controlling layer 53 is the uppermost layer of the laminate 52b. The milling stop layers 55d are exposed at both sides of the laminate 52b in the track width direction (X direction).

The milling stop layers 55d and the RIE-controlling layer 53 are easily etched by reactive ion etching. On the other hand, the etch rates of the first RIE stop layer 36 under the RIE-controlling layer 53 and the second RIE stop layers 56b under the milling stop layers 55d in reactive ion etching are lower than those of the milling stop layers 55*d* and the RIE-controlling layer 53. Thus, the first RIE stop layer 36 and the second RIE stop layers 56 are not easily etched by reactive ion etching.

In a step shown in FIG. 8, the milling stop layers 55*d* and the RIE-controlling layer 53 are removed by reactive ion etching (RIE). At this time, the underlying insulating layers 60*a*, the hard bias layers 54*d*, and the second RIE stop layers 56*b* at regions A each between the corresponding milling stop layer 55*d* and the RIE-controlling layer 53 are also removed by reactive ion etching. The layers at the regions A are successfully removed by reactive ion etching because the layers at the regions A each have a small thickness, the term "thickness" including both thicknesses in the track width direction (X direction) and in the height direction (Z direction). Furthermore, the layers at the regions A may be left to a certain extent. The layers at the regions A are more easily removed by ion milling than reactive ion etching. Thus, for example, the layers at the regions A may be removed as much as possible by further performing ion milling after the ion milling step shown in FIG. 7. At this time, the milling angle θ2 is preferably adjusted to a value such that the layers at the regions A are easily etched.

As shown in FIG. 9, the milling stop layers 55*d*, the RIE-controlling layer 53, and the layers at the regions A are removed by reactive ion etching to complete the laminate 22 having the same structure as that shown in FIG. 1. The reference numerals of the layers in FIG. 9 are the same as those in FIG. 1. The top face 36*a* of the first RIE stop layer 36 is exposed at the top face 22*a* of the laminate 22.

The second RIE stop layers 42 are disposed on the top faces 41*b* and 41*c* of the hard bias layers 41 at both sides of the laminate 22 in the track width direction (X direction). The top faces 42*a* and 42*b* of the second RIE stop layers 42 are exposed. The top face 36*a* of the first RIE stop layer 36 and the top faces 42*a* of the second RIE stop layers 42 are disposed at the same height and are planarized surfaces. Furthermore, the top faces B formed of the hard bias layers 41 and the underlying insulating layers 25 are disposed at the same height as the top face 36*a* of the first RIE stop layer 36 and the top faces 42*a* of the second RIE stop layers 42, the top faces B each being disposed between the first RIE stop layer 36 and the corresponding second RIE stop layer 42. The top faces B are also planarized surfaces. Therefore, a continuous planarized face extends over the top face 36*a* of the first RIE stop layer 36 and the top faces 42*a* of the second RIE stop layers 42.

As described in the step shown in FIG. 8, when the layers at the regions A shown in FIG. 8 are not appropriately removed, i.e., when the layers at the regions A are partly left, the top faces B shown in FIG. 9 can be ridged. However, the ridged portions are negligibly small. Consequently, the tunneling magnetic sensing element has smaller irregularities of the top surface compared with a known art.

After the step shown in FIG. 9, the adjusting layer 43 for adjusting the distance between the shield layers is formed over the top face 22*a* of the laminate 22 and the top faces 42*a* and 42*b* of the second RIE stop layers 42 as shown in FIG. 1. Then, the top shield layer 30 is formed over the adjusting layer 43.

In the process for producing the tunneling magnetic sensing element in accordance with the embodiment shown in FIGS. 3 to 9, the interlayer 65, the first RIE stop layer 66, and the RIE-controlling layer 53 are formed in that order on the free magnetic layer 64 in the step shown in FIG. 3. In the step shown in FIG. 6, the second RIE stop layers 56*b* and the milling stop layers 55*d* are formed in that order on the hard bias layers 54*d* at both sides of the laminate 52*b* in the track width direction (X direction). The etch rates of the first RIE stop layer 36 and the second RIE stop layers 56*b* in reactive ion etching are lower than those of the milling stop layers 55*d* and the RIE-controlling layer 53. The milling stop layers 55*d* and the RIE-controlling layer 53 function as protective layers for protecting the first RIE stop layer 36 and the second RIE stop layers 56*b* from ion milling. The milling rates of the milling stop layers 55*d* and the RIE-controlling layer 53 in ion milling are lower than those of the first RIE stop layer 36 and the second RIE stop layers 56*b*.

Therefore, the second RIE stop layers 56*b* can be appropriately protected during the ion milling step of removing unnecessary layers around the resist layer 51 shown in FIG. 7. In the step shown in FIG. 8, the milling stop layers 55*d* and the RIE-controlling layer 53 that are exposed are simultaneously removed by reactive ion etching. At this time, the first RIE stop layer 36 is disposed under the RIE-controlling layer 53, and the second RIE stop layers 56*b* are disposed under the milling stop layers 55*d*, the first RIE stop layer 36 and the second RIE stop layers 56*b* being resistant to reactive ion etching. Thus, at the completion of reactive ion etching, the milling stop layers 55*d* and the RIE-controlling layer 53 are completely removed, and the first RIE stop layer 36 and the second RIE stop layers 56*b* are successfully left. Therefore, the hard bias layers 54*d* and the free magnetic layer 28 are not affected by reactive ion etching. Furthermore, in the step shown in FIG. 6, the film-forming conditions of the second RIE stop layers 56*b*, the hard bias layers 54*d*, and the like are adjusted such that the top face 36*a* of the first RIE stop layer 36 and the top faces 56*a* of the second RIE stop layers 56*b* are planarized surfaces and are disposed at the same height. Therefore, after reactive ion etching, as shown in FIG. 9, the top face 22*a* of the laminate 22 and the top faces 42*a* of the second RIE stop layers 42 are disposed at the same height. As a result, a planarized surface successfully extends over the top face 22*a* of the laminate 22 and the top faces 42*a* of the second RIE stop layers 42.

Comparison of a known process for producing a tunneling magnetic sensing element with the inventive process for producing the tunneling magnetic sensing element in accordance with the embodiment of the present invention will be made as follows: In the known process for producing the tunneling magnetic sensing element, the first RIE stop layer 36 and the second RIE stop layers 56*b* resistant to reactive ion etching are not formed unlike the embodiment of the present invention. In the known process, the tunneling magnetic sensing element is completed at the point shown in FIG. 8 of the embodiment of the present invention. As is apparent from FIG. 8, there is a large step height between the top face of the laminate and the top faces of regions where the hard bias layers are disposed, the hard bias layers being disposed at both sides of the laminate, and the laminate and the hard bias layers constituting the tunneling magnetic sensing element. Furthermore, the top faces of the regions where the hard bias layers are disposed are curved surfaces, i.e., the top faces of the regions are not planarized surfaces. When the top shield layer is formed over the top surface of the tunneling magnetic sensing element in this state, a variation in the distance between the shield layers is markedly increased.

On the other hand, in the embodiment of the present invention, the milling stop layers 55*d* are disposed on the second RIE stop layers 56*b*. The milling stop layers 55*d* function as protective layers for protecting the second RIE stop layers 56*b* from ion milling. Ultimately, the milling stop layers 55*d* are removed. The RIE-controlling layer 53 is disposed on the first RIE stop layer 36. The RIE-controlling layer 53 is also removed together with the milling stop layers 55*d* in the reactive ion etching step shown in FIG. 8. If the RIE-controlling layer 53 is not provided, the first RIE stop layer 36 is etched by reactive ion etching for a long time. At worst, the first RIE stop layer 36 is completely removed. As a result, the stacked structure under the first RIE stop layer 36 is etched by reactive ion etching. Alternatively, if the first RIE stop layer 36 is not entirely removed and is thus partly left, a large step height disadvantageously exists between the top face of the first RIE stop layer 36 and the top face of each second RIE stop layer 56b after the completion of reactive ion etching. As a result, the variation in the distance between the shield layers cannot be effectively reduced. Therefore, the RIE-controlling layer 53 is disposed on the first RIE stop layer 36. Reactive ion etching is completed when the RIE-controlling layer 53 and the milling stop layers 55d are removed by reactive ion etching to expose the first RIE stop layer 36 and the second RIE stop layers 56b. The first RIE stop layer 36 and the second RIE stop layers 56b are etched to the same degree by reactive ion etching. Thus, there is no step height between the top face of the first RIE stop layer 36 and the top faces of the second RIE stop layers 56b. Even if a step height exists, the step height is smaller than that in the known art. Therefore, it is possible to easily and appropriately produce a magnetic sensing element having a smaller variation in the distance between shield layers compared with that in the known art.

Preferably, the first RIE stop layer 36 and the second RIE stop layers 56b are each composed of the same material. As a result, the etch rate of the first RIE stop layer 36 in reactive ion etching is the same as that of the second RIE stop layers 56b. When the first RIE stop layer 36 and the second RIE stop layers 56b are slightly etched during the reactive ion etching step starting from FIG. 8, the first RIE stop layer 36 and the second RIE stop layers 56b are etched to the same degree. Thus, the top face 36a of the first RIE stop layer 36 and the top faces 42a of the second RIE stop layers 42 can be easily disposed at the same height.

Preferably, the milling stop layers 55d and the RIE-controlling layer 53 are each composed of the same material. As a result, the etch rate of the RIE-controlling layer 53 in reactive ion etching is the same as those of the milling stop layers 55d. When the milling stop layers 55d and the RIE-controlling layer 53 shown in FIG. 8 have the same thickness before reactive ion etching, the removal of the milling stop layers 55d and the RIE-controlling layer 53 by reactive ion etching can be simultaneously completed. In FIG. 8, the milling stop layers 55d each have a thickness different from that of the RIE-controlling layer 53. More preferably, in consideration of the thickness of each milling stop layer 55d to be etched in the ion milling step shown in FIG. 7, the milling stop layers 55d are formed. In other wards, more preferably, the thickness of each milling stop layer 55d is adjusted such that the milling stop layers 55d and the RIE-controlling layer 53 have the same thickness after the ion milling step shown in FIG. 7.

By providing the interlayer 35 composed of, for example, tantalum between the free magnetic layer 28 and the first RIE stop layer 36, a deterioration in the magnetic properties of the free magnetic layer 28 can be suppressed compared with the case where the first RIE stop layer 36 is disposed directly on the free magnetic layer 28. Specifically, the rate of change of the magnetic resistance of the free magnetic layer 28 can be suppressed, thereby improving the stability of the magnetization of the free magnetic layer 28 and improving read output.

What is claimed is:

1. A magnetic sensing element comprising:
   a bottom shield layer;
   a top shield layer;
   a laminate including at least a first reactive-ion-etching stop layer;
   bias layers at both sides of the laminate in the track width direction; and
   second reactive-ion-etching stop layers each disposed on at least part of the corresponding bias layer, the second reactive-ion-etching stop layers functioning as stop layers for reactive ion etching, wherein the laminate, the bias layers, the first reactive-ion-etching stop layer, and the second reactive-ion-etching stop layers are disposed between the bottom shield layer and the top shield layer;
   wherein the top face of the first reactive-ion-etching stop layer and at least part of the top face of each second reactive-ion-etching stop layer are disposed at the same height and are each a planarized surface.

2. The magnetic sensing element according to claim 1, wherein the first reactive-ion-etching stop layer and the second reactive-ion-etching stop layers are composed of the same material.

3. The magnetic sensing element according to claim 1, wherein the first reactive-ion-etching stop layer and the second reactive-ion-etching stop layers are each composed of at least one element selected from the group consisting of Cr, Pt, Ir, Ru, Rh, Pd, and Ag.

4. The magnetic sensing element according to claim 1, wherein the laminate further includes at least a pinned magnetic layer, a nonmagnetic material layer, and a free magnetic layer.

5. The magnetic sensing element according to claim 4, wherein the layers are provided in that order from the bottom.

6. The magnetic sensing element according to claim 5, wherein the first reactive-ion-etching stop layer is the uppermost layer of the laminate and functions as a stop layer for reactive ion etching.

7. The magnetic sensing element according to claim 1, wherein the magnetic sensing element is a tunneling magnetic sensing element including an insulating barrier layer disposed as a nonmagnetic material layer.

8. A tunneling magnetic sensing element, comprising:
   a bottom shield layer;
   a top shield layer;
   a laminate including at least a first reactive-ion-etching stop layer and a nonmagnetic material layer;
   bias layers at both sides of the laminate in the track width direction; and
   second reactive-ion-etching stop layers each disposed on at least part of the corresponding bias layer, the second reactive-ion-etching stop layers functioning as stop layers for reactive ion etching, wherein the laminate, the bias layers, the first reactive-ion-etching stop layer, and the second reactive-ion-etching stop layers are disposed between the bottom shield layer and the top shield layer;
   wherein an insulating barrier layer is disposed as the nonmagnetic material layer.

9. The tunneling magnetic sensing element according to claim 8, wherein the first reactive-ion-etching stop layer and the second reactive-ion-etching stop layers are composed of the same material.

10. The tunneling magnetic sensing element according to claim 8, wherein the first reactive-ion-etching stop layer and the second reactive-ion-etching stop layers are each composed of at least one element selected from the group consisting of Cr, Pt, Ir, Ru, Rh, Pd, and Ag.

11. The tunneling magnetic sensing element according to claim 8, wherein the laminate further includes at least a pinned magnetic layer and a free magnetic layer.

12. The tunneling magnetic sensing element according to claim 11, wherein the pinned magnetic layer, the insulating barrier layer, and the free magnetic layer are provided in that order from the bottom.

13. The tunneling magnetic sensing element according to claim 12, wherein the first reactive-ion-etching stop layer is the uppermost layer of the laminate and functions as a stop layer for reactive ion etching.

* * * * *